United States Patent

Whitney

(10) Patent No.: US 6,211,554 B1
(45) Date of Patent: Apr. 3, 2001

(54) PROTECTION OF AN INTEGRATED CIRCUIT WITH VOLTAGE VARIABLE MATERIALS

(75) Inventor: Stephen J. Whitney, Lake Zurich, IL (US)

(73) Assignee: Littelfuse, Inc., Des Plaines, IL (US)

(*) Notice: Subject to any disclaimer, the term of this patent is extended or adjusted under 35 U.S.C. 154(b) by 0 days.

(21) Appl. No.: 09/456,243

(22) Filed: Dec. 7, 1999

Related U.S. Application Data

(60) Provisional application No. 60/111,498, filed on Dec. 8, 1998.

(51) Int. Cl.[7] .................................................. H01L 23/62
(52) U.S. Cl. ............................ 257/355; 257/787; 257/659
(58) Field of Search ................................... 257/787, 355, 257/659, 660

(56) References Cited

U.S. PATENT DOCUMENTS

| | | |
|---|---|---|
| 2,273,704 | 2/1942 | Grisdale . |
| 2,796,505 | 6/1957 | Bocciarelli . |
| 4,331,948 | 5/1982 | Malinaric et al. . |
| 4,726,991 | 2/1988 | Hyatt et al. . |
| 4,977,357 | 12/1990 | Shrier . |
| 4,992,333 | 2/1991 | Hyatt . |
| 5,142,263 | 8/1992 | Childers et al. . |
| 5,189,387 | 2/1993 | Childers et al. . |
| 5,246,388 * | 9/1993 | Collins et al. . |
| 5,260,848 | 11/1993 | Childers . |
| 5,294,374 | 3/1994 | Martinez et al. . |
| 5,350,594 * | 9/1994 | Unruh . |
| 5,448,095 * | 9/1995 | Hennessey et al. . |
| 5,476,714 | 12/1995 | Hyatt . |
| 5,594,204 * | 1/1997 | Taylor et al. . |
| 5,669,381 | 9/1997 | Hyatt . |
| 5,714,784 * | 2/1998 | Ker et al. . |
| 5,781,395 | 7/1998 | Hyatt . |
| 5,869,869 | 2/1999 | Hively . |
| 5,938,050 * | 11/1998 | Ker et al. . |
| 5,955,762 | 9/1999 | Hively . |
| 5,970,321 | 10/1999 | Hively . |
| 6,097,066 * | 8/2000 | Le et al. . |

FOREIGN PATENT DOCUMENTS

| | | |
|---|---|---|
| WO 99/46819 | 9/1999 | (WO) . |
| WO 99/46820 | 9/1999 | (WO) . |

* cited by examiner

Primary Examiner—Sheila V. Clark
(74) Attorney, Agent, or Firm—Bell, Boyd & Lloyd LLC

(57) ABSTRACT

An integrated circuit die having on board protection against electrical overstress (EOS) transients. A device having an integrated circuit die with an outer periphery and a functional die area. A plurality of conductive input/output pads are formed on the integrated circuit die. A first conductive guard rail is disposed on the integrated circuit die and forms a gap between each one of the input/output pads. A voltage variable material is disposed in the gaps between the conductive guard rail and the input/output pads. A plurality of electrical leads are electrically connected to a respective one of the plurality of conductive input/output pads. At normal operating voltages, the voltage variable material is non-conductive. However, in response to an EOS transient, the voltage variable material switches to a low resistance state, providing a conductive path between the conductive guard rail and the input/output pads.

18 Claims, 5 Drawing Sheets

LEAD FRAME USED FOR ASSEMBLY

PROTECTION OF AN INTEGRATED CIRCUIT WITH VOLTAGE VARIABLE MATERIALS

CROSS-REFERENCE TO RELATED APPLICATIONS

This application claims the benefit of U.S. Provisional Application No. 60/111,498, filed Dec. 8, 1998.

TECHNICAL FIELD

The present invention generally relates to the use of voltage variable materials for the protection of an integrated circuit against electrical overstress (EOS) transients.

BACKGROUND OF THE INVENTION

There is an increased demand for materials and electrical components which can protect electronic circuits from EOS transients which produce high electric fields and usually high peak energies capable of destroying circuits or the highly sensitive electrical components in the circuits, rendering the circuits and the components non-functional, either temporarily or permanently. The EOS transient can include transient voltage or current conditions capable of interrupting circuit operation or destroying the circuit outright. Particularly, EOS transients may arise, for example, from an electromagnetic pulse, an electrostatic discharge, lightning, or be induced by the operation of other electronic or electrical components. Such transients may rise to their maximum amplitudes in microsecond to subnanosecond time frames and may be repetitive in nature. A typical waveform of an electrical overstress transient is illustrated in FIG. 1. The peak amplitude of the electrostatic discharge (ESD) transient wave may exceed 25,000 volts with currents of more than 100 amperes.

Materials for the protection against EOS transients (EOS materials) are designed to respond essentially instantaneously (i.e., ideally before the transient wave reaches its peak) to reduce the transmitted voltage to a much lower value and clamp the voltage at the lower value for the duration of the EOS transient. EOS materials are characterized by high electrical resistance values at low or normal operating voltages and currents. In response to an EOS transient, the material switches essentially instantaneously to a low electrical resistance value. When the EOS threat has been mitigated these materials return to their high resistance value. These materials are capable of repeated switching between the high and low resistance states, allowing circuit protection against multiple EOS events. EOS materials are also capable of recovering essentially instantaneously to their original high resistance value upon termination of the EOS transient. For purposes of this application, the high resistance state will be referred to as the "off-state" and the low resistance state will be referred to as the "on-state."

FIG. 2 illustrates a typical electrical resistance versus d.c. voltage relationship for EOS materials. Circuit components including EOS materials can shunt a portion of the excessive voltage or current due to the EOS transient to ground, thus, protecting the electrical circuit and its components. The major portion of the threat transient is either dissipated at the source resistance or reflected back towards the source of the threat. The reflected wave is either attenuated by the source, radiated away, or re-directed back to the surge protection device which responds with each return pulse until the threat energy is reduced to safe levels.

In particular, the present invention is directed to the application of voltage variable materials to an integrated circuit die to provide protection against EOS transients. Accordingly, any of the following EOS materials and methods for making EOS materials can be used in the present invention, the disclosures of which are incorporated herein by reference.

U.S. Provisional Patent Application No. 60/064,963 discloses compositions for providing protection against EOS. The compositions include a matrix formed of a mixture of an insulating binder, conductive particles having an average particle size of less than 10 microns, and semiconductive particles having an average particle size of less than 10 microns. The compositions utilizing relatively small particle sized conductive and semiconductive fillers exhibit clamping voltages in a range of about 30 volts to about 2,000 volts or greater.

U.S. Pat. No. 2,273,704, issued to Grisdale, discloses granular composites which exhibit non-linear current voltage relationships. These mixtures are comprised of granules of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991, issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductor and semiconductor particles in the 10 to 100 micron range with a minimum proportion of 100 angstrom range insulative particles, bonded together in a insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

Additional EOS polymer composite materials are also disclosed in U.S. Pat. Nos. 4,331,948, 4,726,991, 4,977,357, 4,992,333, 5,142,263, 5,189,387, 5,294,374, 5,476,714, 5,669,381, and 5,781,395, the teachings of which are specifically incorporated herein by reference.

A typical integrated circuit die having a plurality of input/output (I/O) conductive pads is illustrated in FIG. 3. Wires are bonded to the I/O pads and are connected to a corresponding electrical lead of a lead frame. Prior integrated circuit dies have voltage suppression components such as diodes, thyristors or transistors formed on the die near the I/O pads during the processing of the die to protect oxide layers, semiconductor junctions, and metal traces in the functional die area from the harmful effects of EOS transients. The assembly is typically encapsulated in a protective housing and the electrical leads of the lead frame which extend outwardly from the housing are formed in order to be connected to a circuit substrate (e.g., a printed circuit board). The components used to protect the functional area of the die are often relatively large, consuming costly die area which can otherwise be used for additional functions. In addition, the overall encapsulated device is relatively large, consuming costly real estate on the circuit substrate.

SUMMARY OF THE INVENTION

It is an object of the present invention to apply a voltage variable material to an integrated circuit die to provide protection from EOS transients. In a first embodiment of the present invention, an electrical device comprises an integrated circuit die having a functional die area, a plurality of conductive I/O pads, and an outer periphery. A conductive guard rail comprising a conductive trace is formed on the integrated circuit die adjacent the plurality of conductive I/O pads and the functional die area. A gap is formed between each I/O pad and the conductive guard rail. Each one of the plurality of I/O pads is electrically connected to a corresponding electrical lead. A layer of voltage variable material is disposed on the integrated circuit die, filling the gaps between each I/O pad and the conductive guard rail. Preferably, the voltage variable material is in direct contact with the I/O pads and the conductive guard rail. At normal operating voltages (i.e., relatively low voltages), the voltage variable material exhibits a relatively high electrical resistance. However, upon application of an EOS transient energy (i.e., relatively high voltages), the voltage variable material electrically connects the I/O pads to the conductive guard rail. As a result, the voltage variable material creates a conductive path away from the functional area of the die for the EOS transient energy to follow.

In a second embodiment of the present invention an electrical device comprises an integrated circuit die having an integrated circuit die having an outer periphery and a functional die area. A first and a second conductive guard rail and a plurality of conductive I/O pads are disposed on the integrated circuit die. A gap is formed between each of the first and second guard rails and the I/O pads. At least one of the plurality of conductive I/O pads is electrically connected to an electrical lead. A voltage variable material is disposed on the integrated circuit die filling the gaps between each of the first and second conductive rails and the I/O pads. The voltage variable material is in electrical communication, and preferably in direct contact with, the first and second conductive rails and the I/O pads. At normal operating voltages (i.e., relatively low voltages), the voltage variable material exhibits a relatively high electrical resistance. Thus, current is not conducted between the first and second conductive rails and the I/O pads. However, upon application of an EOS transient energy (i.e., relatively high voltages), the voltage variable material switches to a relatively low electrical resistance and electrically connects the I/O pads to the conductive guard rails. As a result, the voltage variable material creates a conductive path away from the functional area of the die for the EOS transient energy to follow. A protective housing having the electrical leads extending therefrom covers the integrated circuit die.

Other advantages and aspects of the present invention will become apparent upon reading the following description of the drawings and detailed description of the invention.

DETAILED DESCRIPTION OF THE INVENTION

Figure 1:
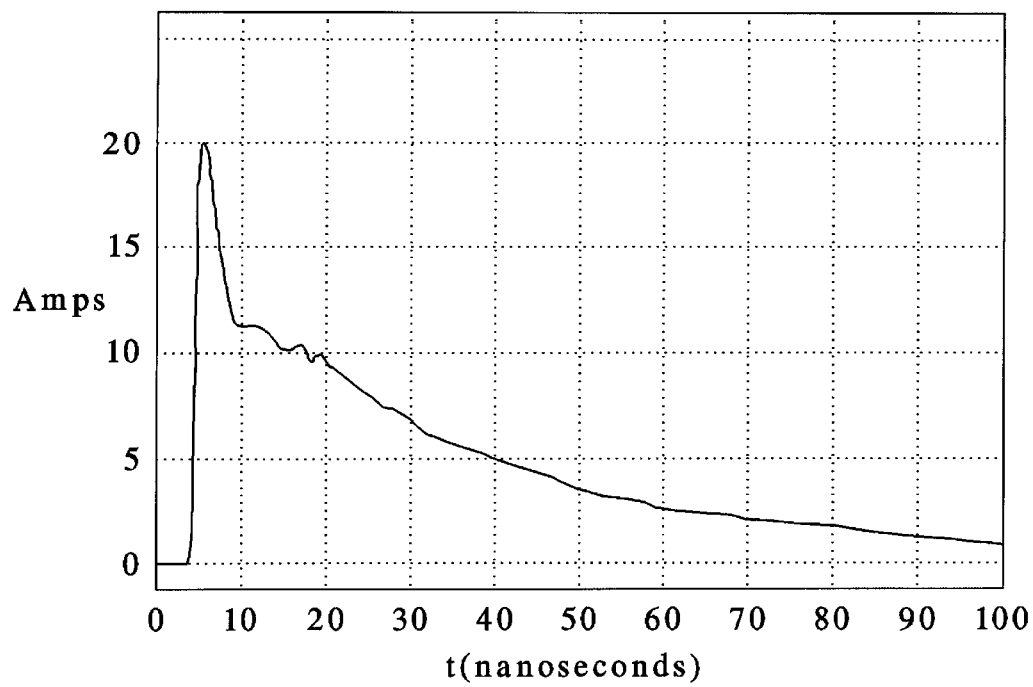
FIG. 1 graphically illustrates a typical current waveform of an EOS transient.
Figure 2:
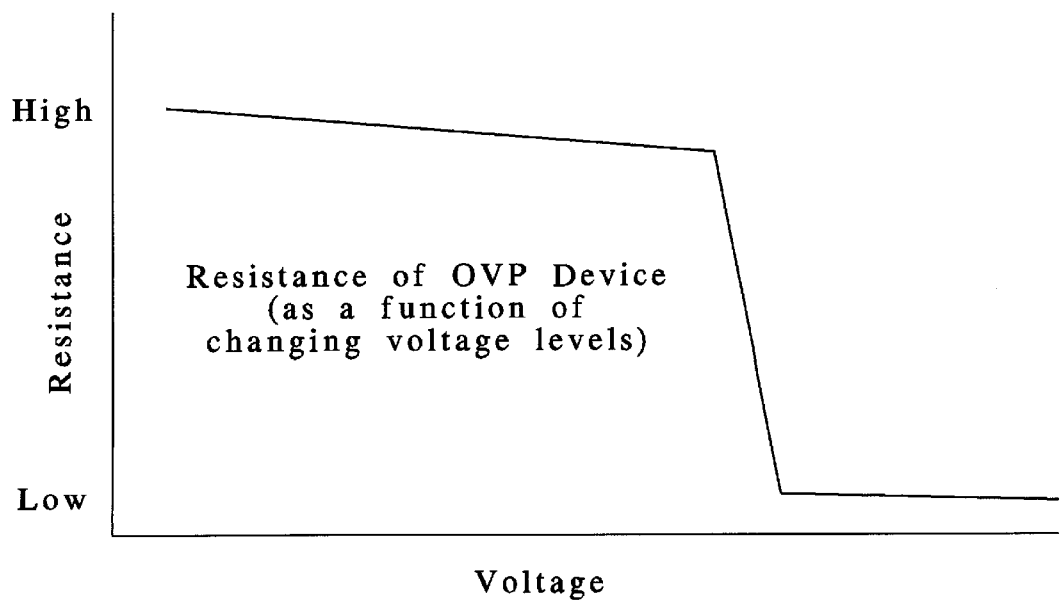
FIG. 2 graphically illustrates the electrical resistance versus d.c. voltage relationship of typical EOS materials.

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiments illustrated.

Figure 3:
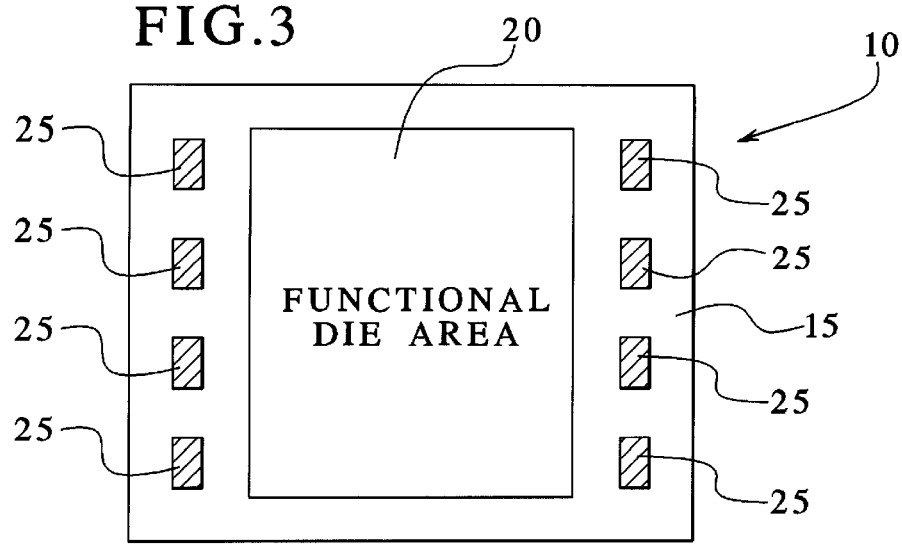
FIG. 3 illustrates a typical integrated circuit die.

A conventional integrated circuit die 10 is illustrated in FIG. 3. The die 10 is typically comprised of a silicon wafer 15 having a functional die area 20 and a plurality of conductive I/O pads 25. The functional area 20 of the die 10 has a circuit integrated therein. It should be generally understood by those having skill in the art that the integrated circuit can be created by various process; e.g., by doping the silicon, or depositing resistive and conductive films on the wafer and imposing patterns to form an electrical network. The present invention is concerned with protecting the integrated circuit from extremely high energies associated with EOS transients.

Figure 4:
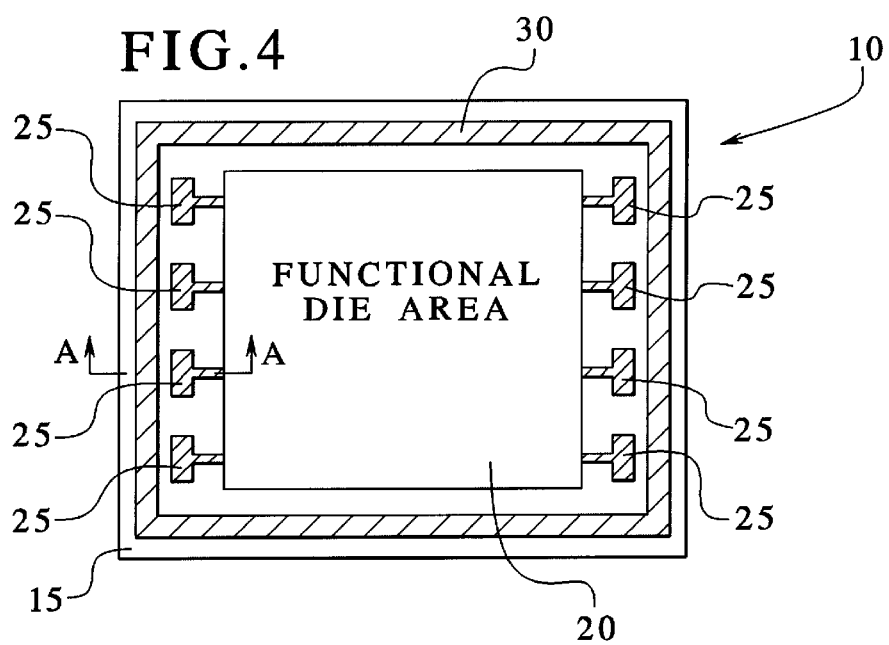
FIG. 4 illustrates a top view of an integrated circuit die according to one embodiment of the present invention.

With reference to FIG. 4, the integrated circuit die 10 of the present invention includes a plurality of conductive I/O pads 25 disposed on the surface of the die 10. The conductive I/O pads 25 are electrically connected to the integrated circuit, i.e., the function die area 20. A first conductive guard rail 30 is disposed on the die 10. Preferably, the guard rail 30 is disposed on the die 10 adjacent to the I/O pads 25 and is comprised of a metallized trace. A gap 25a is formed between the guard rail 30 and each one of the I/O pads 25 on the surface of the die 10. A voltage variable material 35 is disposed on the surface of the die 10, filling the gaps 25a between the conductive guard rail 30 and each one of the plurality of I/O pads 25. The voltage variable material 35 is in electrical contact, and preferably in direct contact with, the first and second conductive rails and the I/O pads. At normal operating voltages (i.e., relatively low voltages), the voltage variable material exhibits a relatively high electrical resistance. Thus, energies associated with the normal operation of the integrated circuit are not applied between the first conductive rail 30 and the I/O pads 25. However, upon application of an EOS transient energy (i.e., relatively high voltages), the voltage variable material 35 switches to a relatively low electrical resistance and electrically connects the I/O pads 25 to the conductive guard rail 30. As a result, the voltage variable material 35 creates a conductive path away from the functional area of the die 20 for the EOS transient energy to follow. The conductive guard rail 30 can be connected to a ground rail or a +/− power supply rail.

Figure 8:
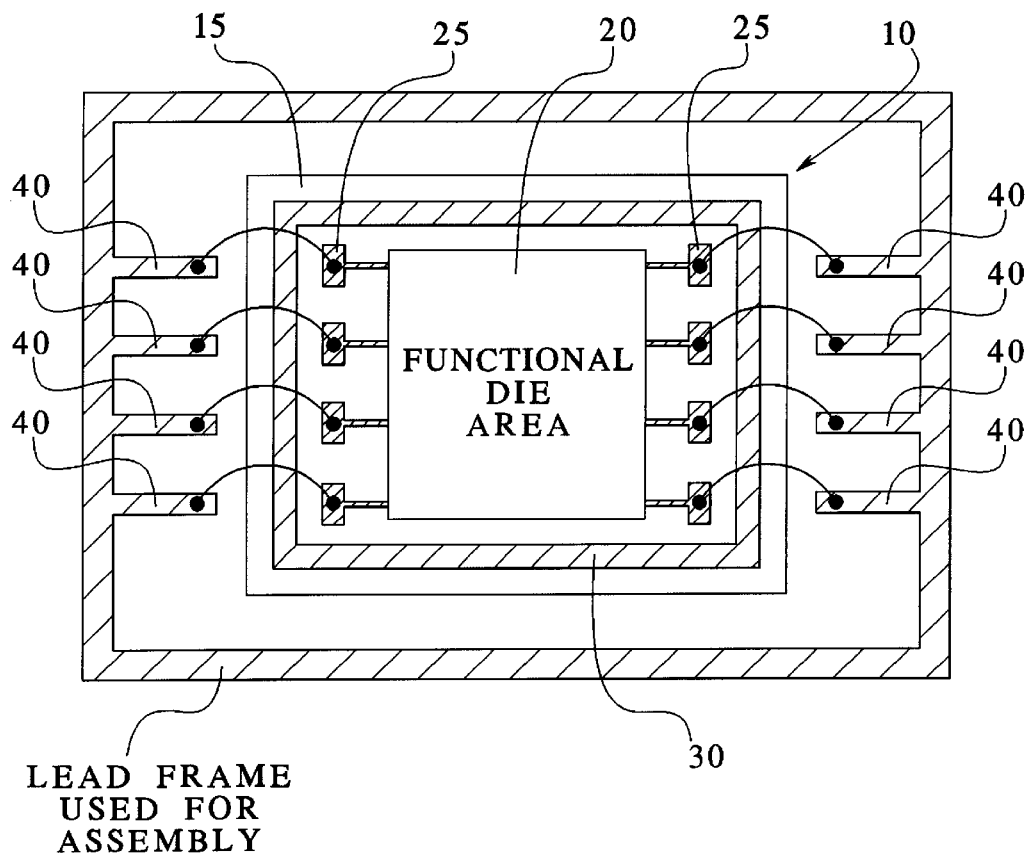
FIG. 8 illustrates an integrated circuit die according to the present invention electrically connected to a lead frame assembly.

As shown in FIG. 8, a plurality of electrical leads 40 are electrically connected to a respective one of the plurality of conductive I/O pads 25. Typically, the electrical leads 40 are wire bonded to the I/O pads 25.

Figure 5:
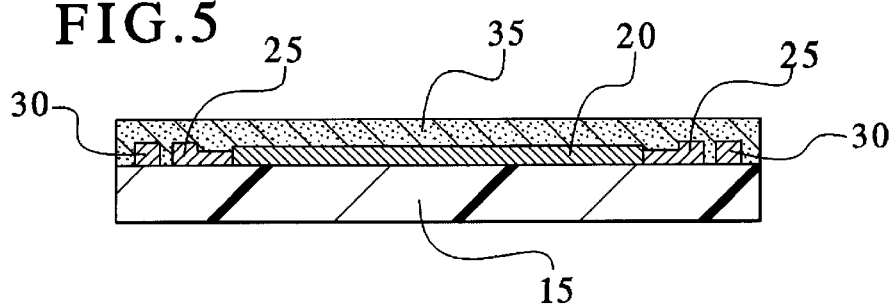
FIG. 5 illustrates a cross-sectional view along line A—A of the integrated circuit die shown in FIG. 4 having a layer of voltage variable material deposited over the top surface of the die.

In a preferred embodiment, the voltage variable material 35 is applied to the entire surface of the die 10 completely covering the guard ring 30, the plurality of I/O pads 25 and the functional die area 20 (as shown in the cross-sectional view of FIG. 5). However, the voltage variable material 35 can be applied in any manner or configuration as long as the material 35 connects the I/O pads 25 to the conductive guard rail 30. For example, the material 35 can be applied as two separate strips, each strip connecting the I/O pads 25 located on opposite sides of the die 10 to the guard rail 30, or each I/O pad 25 could be connected to the guard rail 30 with a separate body of voltage variable material 35.

Figure 10:
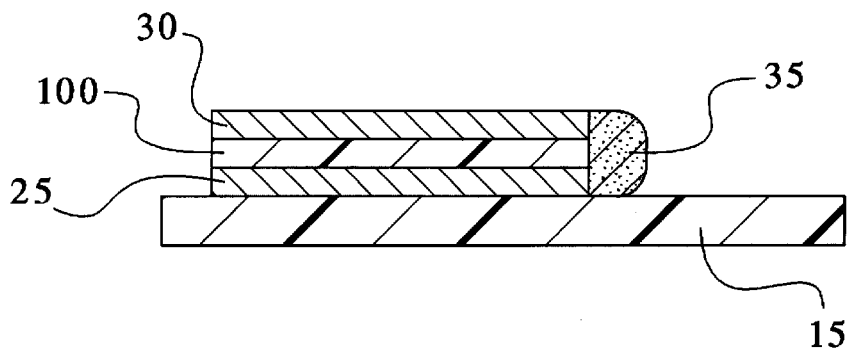
FIGS. 10–12 illustrate alternative embodiments wherein a voltage variable material connects a conductive guard rail in a first plane to an I/O pad in a second plane.
Figure 11:
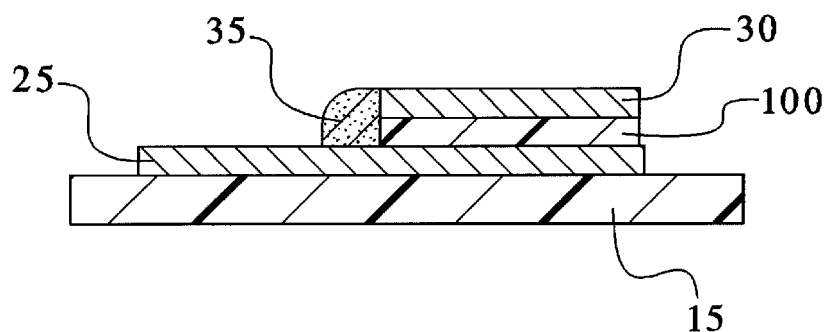
Figure 12:
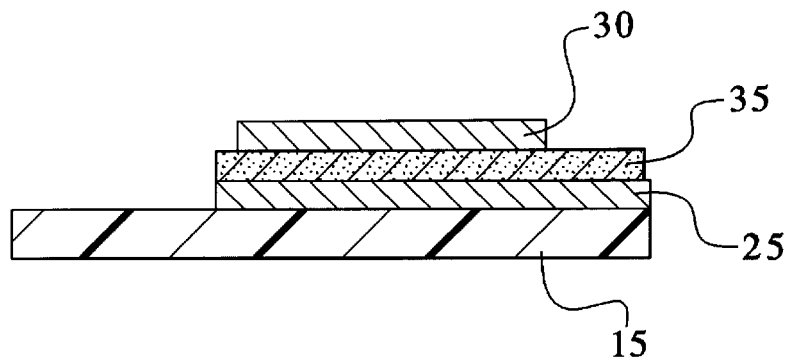

The present invention also contemplates arrangements wherein the I/O pads 25 and the conductive guard rail 30 are connected to the die 10 in different planes. For example, the voltage variable material 35 can be interposed between the I/O pads 25 and the conductive guard rail 30 (see FIG. 12), or the voltage variable material 35 can butt up against the ends of the I/O pads 25 and the conductive guard rail 30 with an insulating layer 100 separating the I/O pads 25 and the conductive guard rail 30 (see FIG. 10), or the voltage variable material 35 can be disposed on one of either the I/O pads 25 or the conductive guard rail 30 and butt up against the end of the other one of the I/O pads 25 or the conductive guard rail 30 with an insulating layer 100 separating the I/O pads 25 and the conductive guard rail 30 (see FIG. 11).

When an EOS transient is discharged to one of the electrical leads 40, a voltage is applied to the corresponding I/O pad 25. This applied voltage from the EOS transient is much higher than the voltage supplied by the power supply rail. The much higher voltage causes the voltage variable material 35 to rapidly switch (e.g., a matter of nanoseconds) from a high resistance state to a low resistance state, collapsing the voltage across the gap 25a between the I/O pad 25 and the guard rail 30. As a result, the sensitive integrated circuit structures in the functional die area 20 are protected from the harmful affects of the EOS transient energy. To achieve protection across a wider range of voltages, the voltage variable material 35 could be used in combination with one or more discrete voltage suppression devices also electrically connected to the I/O pads 25. As mentioned above, such devices may include a diode, thyristor or transistor.

Figure 6:
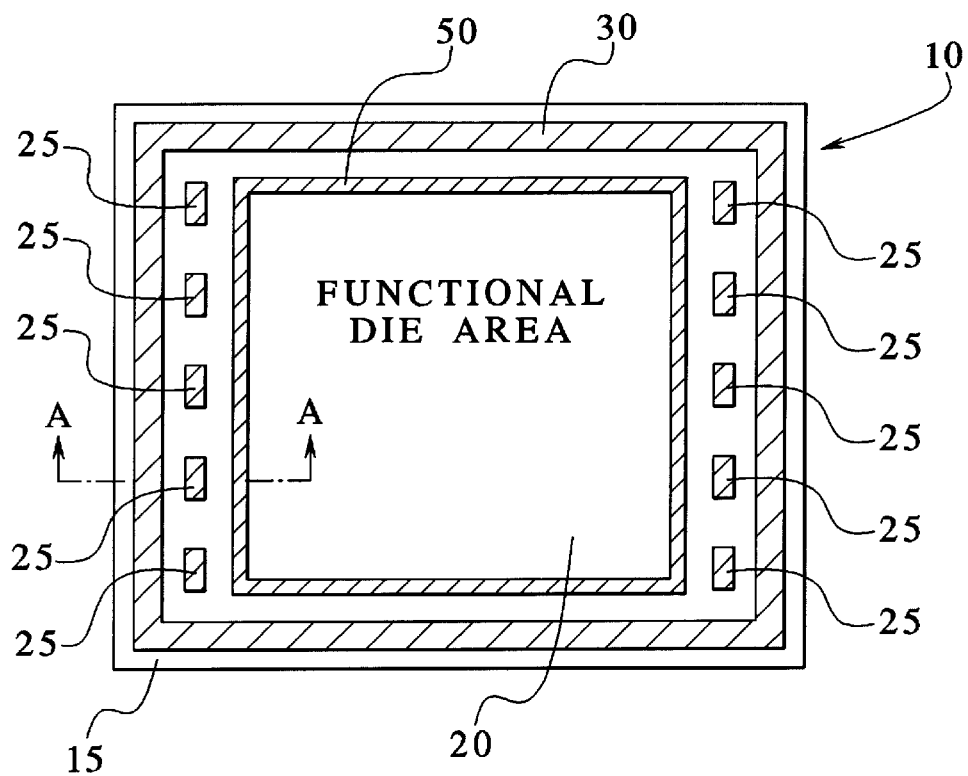
FIG. 6 illustrates a top view of an integrated circuit die according to another embodiment of the present invention.
Figure 7:
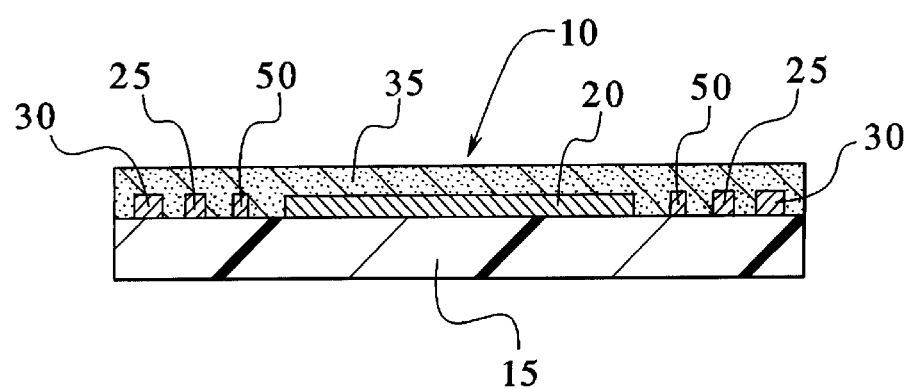
FIG. 7 illustrates a cross-sectional view along line A—A of the integrated circuit die shown in FIG. 6 having a layer of voltage variable material deposited over the to surface of the die.

A preferred embodiment is shown in FIGS. 6 and 7, wherein a second conductive guard rail 50 is disposed on the surface of the integrated circuit die 10. In this embodiment, the guard rails 30,50 are formed adjacent to and on opposite sides of the I/O pads 25. In this sandwich configuration, the first conductive guard rail 30 is electrically connected to a positive power supply rail and the second conductive guard rail 50 is electrically connected to the negative power supply rail. A gap 25a is formed between each of the first and second guard rails 30,50 and the I/O pads 25. The voltage variable material 35 provides a path between the I/O pads 25 and the first and second conductive guard rings 30,50. At normal operating voltages, this path is not conductive. However, at the higher voltages associated with EOS transients, the path becomes conductive, thus, leading the EOS transient energy away from the functional die area 20.

Preferably, the voltage variable material 35 is applied to the surface of the integrated circuit die 10 and covers at least the I/O pads 25 and the conductive guard rails 30,50. In a more preferred embodiment, the voltage variable material 35 is applied to the entire surface of the integrated circuit die 10. It should be understood by those having skill in the art that many different configurations of guard rails 30,50 can be used depending on the size and shape of the die 10 and the size and complexity of the electrical components forming the integrated circuit.

As discussed above, a wide range of voltage variable materials 35 can be used in the present invention. Although the scope of the present invention is not limited to any particular material, a voltage variable material 35 exhibiting a high impedance at normal circuit operating voltages is preferred.

Figure 9:
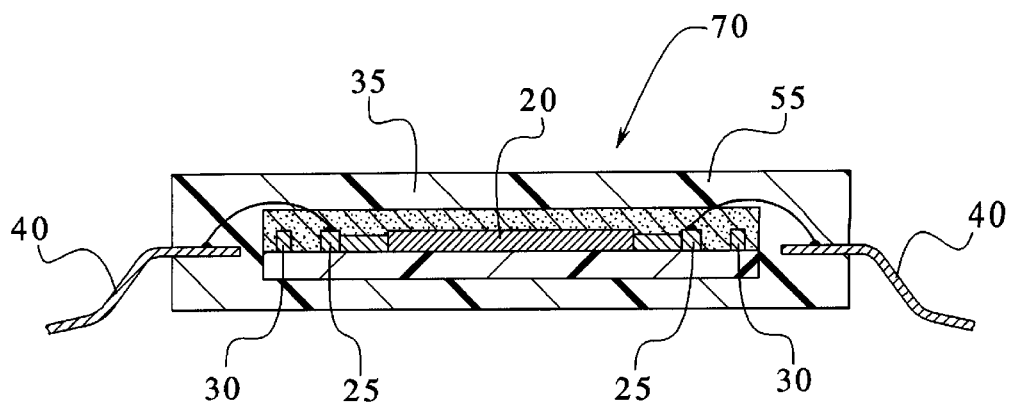
FIG. 9 illustrates the integrated circuit die of FIG. 8 encapsulated in a protective housing.

In another preferred embodiment, illustrated in FIG. 9, a protective housing 55 covers the integrated circuit die 10. The protective housing 55, preferably formed from an electrically insulating material, encapsulates the integrated circuit die 10 and physically connects the plurality of electrical leads 40 to the integrated circuit die 10. The electrical leads 40 project outwardly from the protective housing 55 and are adapted for electrically connecting the device 70 to a source of power.

The electrical devices of the present invention: (1) protect against high EOS transient energies; and (2) may eliminate the need for on-die voltage suppressor components for certain applications and permit the use of smaller on-die voltage suppressor components for other applications. In addition, utilizing a voltage variable material on an integrated circuit die in the manner disclosed herein consumes less die area than traditional semiconductor voltage suppression components while having the capability of protecting against comparable EOS transient energies.

While the specific embodiments have been illustrated and described, numerous modifications come to mind without significantly departing from the spirit of the invention and the scope of protection is only limited by the scope of the accompanying Claims.

What is claimed is:

1. An electrical device for providing protection against EOS transients, the device comprising:
   an integrated circuit die;
   a plurality of conductive input/output pads disposed on the integrated circuit die;
   a first conductive guard rail disposed on the integrated circuit die adjacent the plurality of conductive input/output pads forming a gap between the conductive guard rail and each one of the conductive input/output pads;
   a voltage variable material disposed in the gaps and forming a path between each one of the plurality of conductive input/output pads and the first conductive guard ring; and
   a plurality of electrical leads electrically connected to a respective one of the plurality of conductive input/output pads.

2. The electrical device of claim 1, wherein the integrated circuit die has an integrated circuit which operates at a normal voltage, $V_n$, and at $V_n$ the path formed by the voltage variable material between the input/output pads and the first conductive guard rail is non-conductive.

3. The electrical device of claim 1, wherein the integrated circuit die has an integrated circuit which operates at a normal voltage, $V_n$, and the voltage variable material exhibits a relatively high impedance at $V_n$.

4. The electrical device of claim 1 further including a second conduct guard rail disposed on the integrated circuit die and the voltage variable material connects the first and second conductive guard rails to the plurality of conductive input/output pads.

5. The electrical device of claim 1, wherein the first conductive guard rail comprises a metallized trace.

6. The electrical device of claim 4, wherein the second conductive guard rail comprises a metallized trace and is disposed on the integrated circuit die between an outer periphery of the integrated circuit die and the plurality of conductive input/output pads.

7. The electrical device of claim 1, wherein the voltage variable material is disposed on the entire surface of the integrated circuit die.

8. The electrical device of claim 6, wherein the voltage variable material covers a portion of the surface of the integrated circuit die which lies between the first and second conductive guard rails.

9. The electrical device of claim 1, wherein each one of the plurality of conductive input/output pads has an additional discrete voltage suppression device electrically connected thereto.

10. The electrical device of claim 8, wherein the additional discrete voltage suppression device is a device selected from the group including a diode, a transistor and a thyristor.

11. An electrical device comprising:

an integrated circuit die having an outer periphery and a functional die area;

a first conductive guard rail disposed on the integrated circuit die;

a second conductive guard rail disposed on the integrated circuit die;

a plurality of conductive input/output pads disposed on the integrated circuit die forming gaps between the input/output pads and the first and second guard rails;

a plurality of electrical leads electrically connected to a respective one of the plurality of conductive input/output pads;

a voltage variable material disposed on the integrated circuit die filling the gaps between the input/output pads and the first and second conductive guard rails, the voltage variable material electrically connecting the plurality of conductive input/output pads to the first and second conductive guard rails in response to an EOS transient energy; and a protective housing covering the integrated circuit die, the plurality of electrical leads extending outwardly from the protective housing.

12. The electrical device of claim 11, wherein the protective housing encapsulates the integrated circuit die.

13. The electrical device of claim 11, wherein the protective housing is formed from an electrically insulating material.

14. The electrical device of claim 11, wherein the protective housing physically connects the plurality of electrical leads to the integrated circuit die.

15. The electrical device of claim 11, wherein the voltage variable material comprises a layer which covers at least the first and second conductive guard rails and the plurality of conductive input/output pads.

16. The electrical device of claim 11, wherein each one of the plurality of conductive input/output pads is wire bonded to at least one of the plurality of electrical leads.

17. The electrical device of claim 11, wherein the first and second conductive guard rails are disposed on the integrated circuit die such that the plurality of conductive input/output pads are interposed between the first and second conductive guard rails on the integrated circuit die.

18. An integrated circuit comprising:

an electrically insulating substrate having at least one microelectronic device formed thereon;

a conductive input/output pad formed on the substrate;

a conductive guard rail formed on the substrate;

a voltage variable material disposed on the substrate between the microelectronic device and the input/output pad and forming a path between the conductive input/output pad and the conductive guard rail, the voltage variable material exhibiting non-conductive behavior at normal circuit operating voltages and electrically connecting the input/output pad to the conductive guard rail when an EOS transient is introduced into the circuit.

* * * * *